United States Patent [19]
Frye et al.

[11] Patent Number: 5,534,465
[45] Date of Patent: Jul. 9, 1996

[54] METHOD FOR MAKING MULTICHIP CIRCUITS USING ACTIVE SEMICONDUCTOR SUBSTRATES

[75] Inventors: Robert C. Frye, Piscataway; King L. Tai, Berkeley Heights, both of N.J.

[73] Assignee: AT&T Corp., Murray Hill, N.J.

[21] Appl. No.: 370,902

[22] Filed: Jan. 10, 1995

[51] Int. Cl.$^6$ .................................................. H01L 21/60
[52] U.S. Cl. ........................ 437/209; 437/214; 437/217; 437/219; 437/220
[58] Field of Search .................................. 437/209, 211, 437/214, 215, 217, 218, 219, 220; 257/778; 361/761, 762, 763, 764, 765, 766

[56] References Cited

U.S. PATENT DOCUMENTS

| | | | |
|---|---|---|---|
| 4,460,938 | 7/1984 | Clei | 361/766 |
| 4,764,804 | 8/1988 | Sahara et al. | 437/215 |
| 5,068,201 | 11/1991 | Spinner, III et al. | 437/200 |
| 5,162,264 | 11/1992 | Haug et al. | 437/215 |
| 5,239,448 | 8/1993 | Perkins et al. | 257/778 |
| 5,258,648 | 11/1993 | Lin | 257/778 |
| 5,262,351 | 11/1993 | Bureau et al. | 437/215 |
| 5,365,405 | 11/1994 | Hoenlein et al. | 361/761 |
| 5,371,029 | 12/1994 | Abdo et al. | 437/218 |
| 5,383,093 | 11/1995 | Nagasaka | 361/765 |

*Primary Examiner*—Tom Thomas
*Assistant Examiner*—Kevin M. Picardat
*Attorney, Agent, or Firm*—Glen E. Books

[57] ABSTRACT

In accordance with the invention, a multichip circuit is fabricated by providing an active semiconductor substrate comprising a set of isolated components including active components such as transistors, forming on a surface of the substrate a plurality of paths incorporating components from the substrate for interconnecting a plurality integrated circuit devices, and mounting the ICs on the surface in contact with their respectively appropriate paths. The preferred active substrate is similar in structure to a silicon integrated circuit except that the circuit components are interconnected only by the paths interconnecting the ICs. Advantageously the ICs are surface mounted on the substrate.

5 Claims, 3 Drawing Sheets

METHOD FOR MAKING MULTICHIP CIRCUITS USING ACTIVE SEMICONDUCTOR SUBSTRATES

FIELD OF THE INVENTION

This invention relates to a method for making circuits using a multiplicity of interconnected integrated circuits (multichip circuits). In particular, the method provides an active semiconductor substrate upon which the integrated circuits can be mounted, and within the active substrate, a full complement of isolated components for interconnecting the integrated circuits.

BACKGROUND OF THE INVENTION

The conventional approach to making multichip circuits provides a printed wiring board (PWB) having a desired pattern of metal interconnects and mounting the integrated circuits (typically in packages with metal leads) in appropriately patterned locations on the board. In addition to the interconnections, PWBs also permit the use of additional discrete components that are necessary for the circuits, such as discrete resistors, capacitors and transistors.

This conventional approach worked well with digital circuits which generally required little more than a pattern of conductive leads interconnecting several digital chips. It does not, however, work well with analog and mixed-signal circuits which often require active components in the interconnection paths. Chips can be custom designed to provide the desired active components, but this custom design is expensive and fails to fully exploit the economies of scale available through the use of commodity chips. Thus fabrication of such circuits using PWB technology typically involves the expensive and area-consuming process of applying numerous discrete components in addition to the ICs. Accordingly, there is a need for an improved method for making multichip circuits.

SUMMARY OF THE INVENTION

In accordance with the invention, a multichip circuit is fabricated by providing an active semiconductor substrate comprising a set of isolated components including active components such as transistors, forming on a surface of the substrate a plurality of paths incorporating components from the substrate for interconnecting a plurality integrated circuit devices, and mounting the ICs on the surface in contact with their respectively appropriate paths. The preferred active substrate is similar in structure to a silicon integrated circuit except that the circuit components are interconnected only by the paths interconnecting the ICs. Advantageously the ICs are surface mounted on the substrate.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
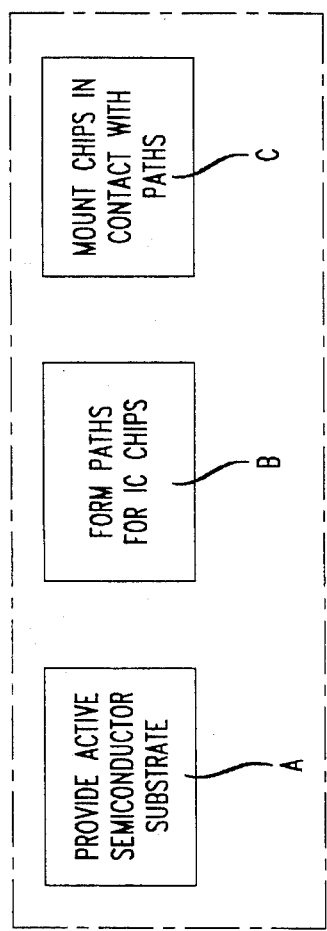
FIG. 1 is a flow diagram of the steps in making a multichip circuit in accordance with the invention.

Referring to the drawings, FIG. 1 is a schematic flow diagram of a preferred process for making a multichip circuit. An initial step, shown in block A, is to provide an active semiconductor substrate comprising a set of isolated components to be used in interconnecting the integrated circuits. Advantageously, the active substrate is a silicon substrate having the components formed near one surface using conventional processes.

Figure 2:
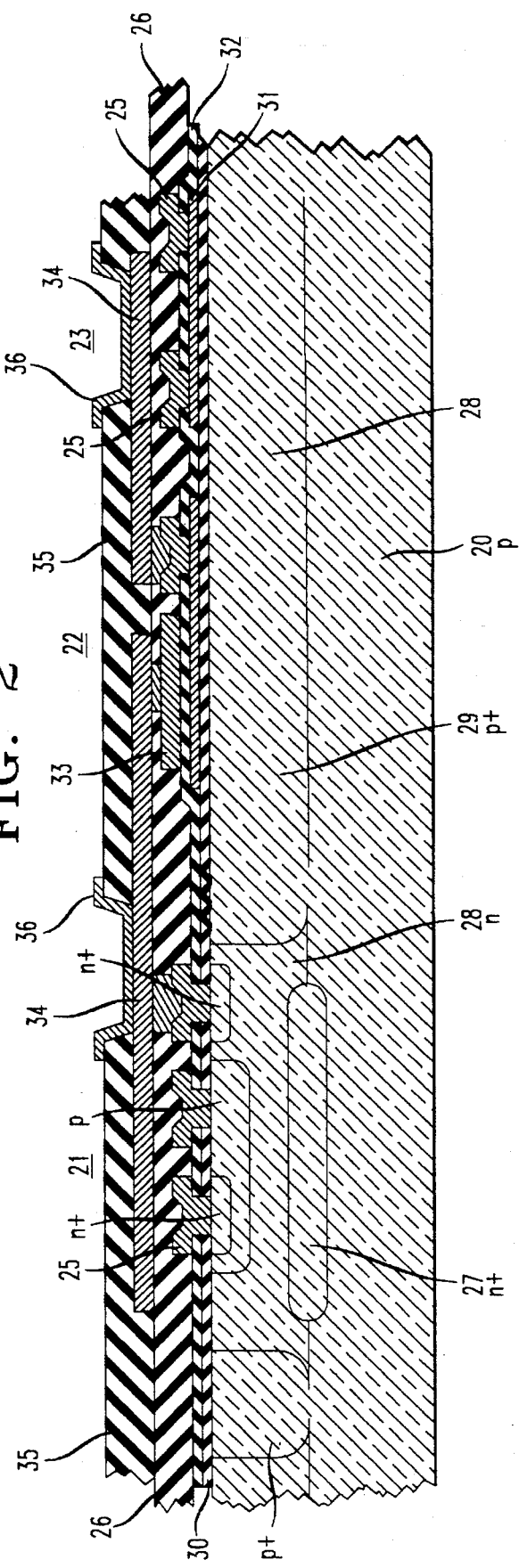
FIG. 2 is a schematic cross section of an active substrate.

FIG. 2 is a schematic cross section of a portion of such an active substrate comprising a p-type silicon substrate 20 including a bipolar transistor 21, a capacitor 22 and a resistor 23. While the transistor 21, is a conventional npn transistor, pnp transistors can also be used. The resistor 23 is preferably a tantalum silicide resistor. Each of the devices is provided with metal contacts 25, and a layer of insulating material 26, such as polyimide, is applied over the outer surface.

The active substrate of FIG. 2 can be made by a combination of conventional processes. The bipolar devices can be made by the well known double-diffused epitaxial process. The starting material is relatively lightly doped (10Ω cm p-type silicon). Heavily doped n-type regions 27 are formed in the substrate and then a lightly doped, n-type epitaxial layer 28 is grown over the surface, forming the buried collectors. In the regions outside the active bipolar devices, diffused p-type isolation regions 29 are patterned, separating each device in its own n-type tub. These n-type regions (e.g. 28) ultimately form the collectors of npn transistors.

After formation of the collector regions, the p-type base diffusion and the n+emitter diffusion are patterned. In addition to forming the emitters, the emitter diffusion is also used in the n-type collector region to help lower the collector contact resistance. In the course of these diffusions, the wafer is also oxidized to form a thin oxide layer 30. A thin resistive film 31 such as TaSi is applied on the oxide layer and patterned into thin-film resistors and the bottom electrodes for capacitors. The patterned layer is then covered by an insulating layer 32 of high temperature silicon nitride. The nitride layer provides a dielectric in capacitors between the TaSi and a higher conductive layer 33 such as aluminum which can form the upper electrodes as well as contacts 25.

The light p doping of the substrate is important to avoid auto-doping upward into the n tub and to minimize the capacitive coupling between the tub and the substrate. Because the substrate is more resistive than the substrates in conventional digital multichip circuits, it is preferably not used for ground. Rather, at some point on the module (not shown) a contact is provided from the substrate isolation region to the most negative potential in the circuit, typically ground.

Figure 3:
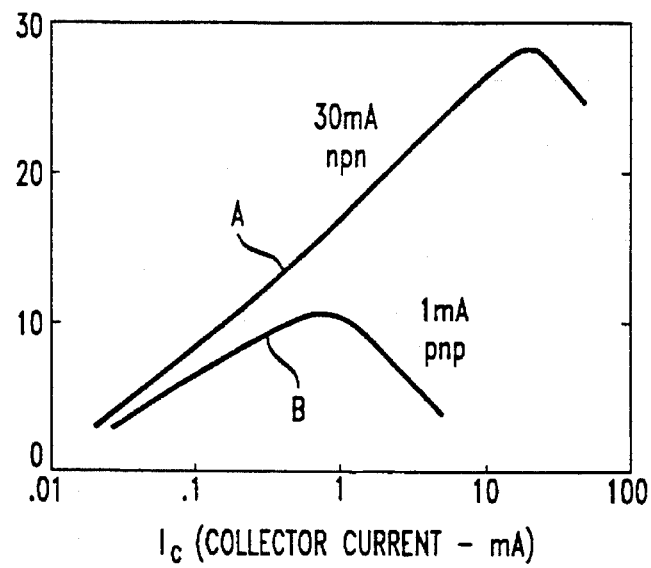
FIG. 3 is a graphical illustration of the characteristics of transistors used in the active substrate of FIG. 2.

The basic process used to make the substrate transistors is conventional bipolar technology using 15 μm or 10 μm design rules. Other bipolar devices, such as diodes and lateral pnp transistors, can be made using the same diffusions. While the substrate devices made by these processes are less than ideal, they are adequate for most interconnection applications. FIG. 3 shows measured current gain as a function of collector current for two types of transistors useful in the active substrate. Curve A is for a basic npn transistor with a mid-range current capability that is well suited for many common circuit applications. Curve B is for a lateral pnp transistor. Optimal operating currents for these devices are indicated by peaks in the gain versus current curves. Higher operating currents can be obtained by building up parallel implementations of these devices. In practice, npn transistors can be scaled to provide current capabilities ranging from 10 to 250 mA. Operating parameters of these transistors are listed in Table 1:

| Property | 30 mA npn | 1 mA pnp |
|---|---|---|
| Size (μm) | 330 × 220 | 210 × 140 |
| ideal maximum forward β | 30 | 10 |
| cut-off frequency, $f_T$ (MHz) | 330 | 80 |
| collector-emitter breakdown voltage BVsunCEO (V) | 45 | 45 |
| Zero bias collector-substrate capacitance (pF) | 17 | — |
| Zero bias base-substrate capacitance (pF) | — | 11 |

The active substrate at this stage of the process is much like a conventional integrated circuit except that in the active substrate the various devices are isolated and not interconnected.

Having prepared the substrate, the next step in the process of FIG. 1, shown in block B, is to provide a plurality of electrical paths for interconnecting a plurality of integrated circuit chips. This step involves opening vias in the insulating layer, building up additional conductive layer 34 (preferably aluminum) and additional insulating layer 35 (preferably polyimide) and capping off contact sites with wettable metal regions 36 such as Ti:Ni:Au. Openings are provided in the insulating layers and the upper conductive layer 34 is patterned so that each electrical path between IC chips passes through a desired sequence of components. For example, FIG. 2 shows an active substrate having a path between the two regions 36 from the collector of transistor 21 through layer 34 and capacitor 22.

Figure 4:
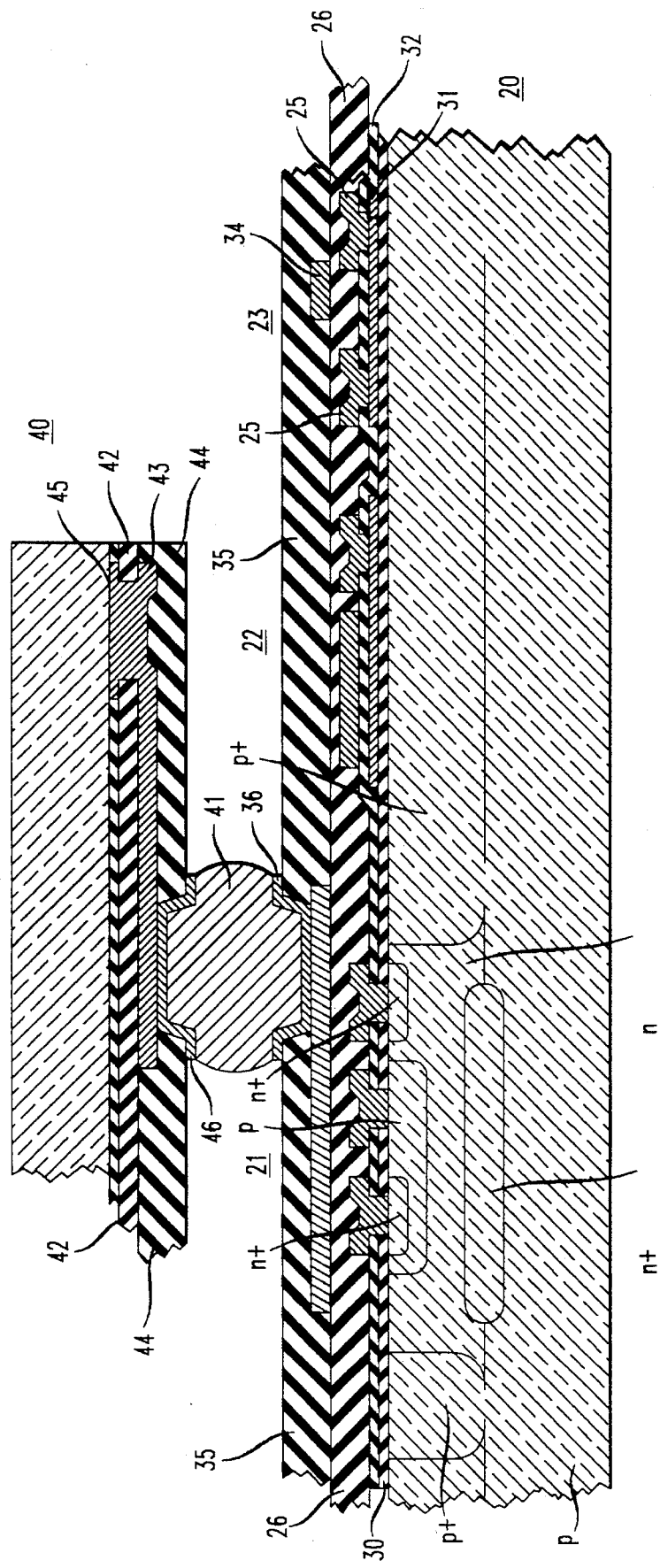
FIG. 4 is a schematic cross section of a portion of a multichip circuit made in accordance with the process of FIG. 1.

The third step shown in block C of FIG. 1 is to connect the chips constituting the circuit to their respective paths through the active substrate. This is preferably accomplished as shown in FIG. 4 by flip-chip surface mounting the chips 40 via solder bumps 41 to the solder wettable metal regions 36 on the substrate 20. The chips are advantageously provided with successive layers of polymeric insulator 42, metal 43 and polymeric insulator 44, patterned to provide contact to the chip wire-bond pads 45. Wettable metal regions 46 are also provided. The chips are then interconnected by solder bumps 41 to appropriate paths on the active substrate using flip-chip surface mounting techniques.

Figure 5:
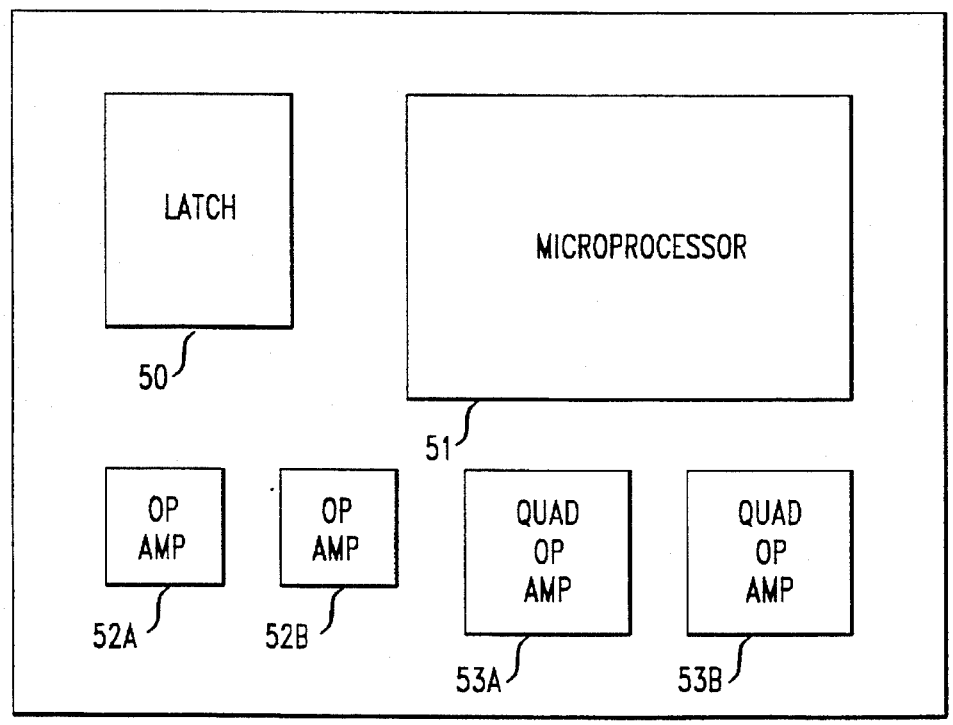
FIG. 5 shows the general layout of a typical multichip circuit made by the process of FIG. 1.

The result is a compact circuit providing a wide variety of components for interconnecting integrated circuit chips. The availability of bipolar interconnecting components in the active substrate permits exploitation of conventional mass produced IC chips with a minimum of added discrete components. FIG. 5 shows the physical design of a telephone circuit constituting six chips: a latch 50, a microprocessor 51, operational amplifiers 52A and 52B and quad-operational amplifiers 53A and 53B. The outlines of the chips, showing their size and location is superimposed on the layout. The circuit is mixed signal, containing both digital and analog circuitry. To minimize noise from the digital circuitry into the analog, the digital and analog portions of the circuit have been physically segregated in the upper and lower halves of the substrate. The digital microprocessor and latch detect and decode keypad entries, control volume and drive a small LCD display. The operational amplifiers provide basic audio signal amplification in both the receive and transmit circuits of the telephone. The active substrate contains 11 capacitors, 117 resistors, 29 transistors and 11 diodes. The overall dimensions are 6.75 mm by 9.5 mm for an overall area less than 0.7 cm$^2$.

While specific embodiments of the invention are shown and described in this application, the invention is not limited to these particular forms. For example, while the chips are preferably connected to the substrate by solder balls, they could alternatively be connected by conventional wire bonding techniques. The invention also applies to further modifications and improvements that do not depart from the spirit and scope of this invention.

We claim:

1. A method for making a circuit comprising a plurality of integrated circuit chips comprising the steps of:

providing a semiconductor substrate having formed therein a set of isolated and unconnected electrical components for interconnecting said circuit chips, said components including at least one bipolar transistor;

forming a plurality of electrical paths for interconnecting said circuit chips, said electrical paths including electrical components in said semiconductor substrate; and mounting said chips on said substrate in electrical contact with said electrical paths to form a circuit comprising said interconnected plurality of chips.

2. The method of claim I wherein said semiconductor substrate is a silicon substrate and said set of electrical components further comprises resistors and capacitors.

3. The method of claim 1 wherein said chips are mounted on said substrate by flip-chip surface mounting.

4. The method of claim 1 wherein said bipolar transistor is an npn transistor.

5. The method of claim 2 wherein said resistors are TaSi resistors.

\* \* \* \* \*